United States Patent [19]

Kleiss et al.

[11] Patent Number: 4,948,988

[45] Date of Patent: Aug. 14, 1990

[54] POWER SUPPLY CONTROL FOR LOW VOLTAGE I²L CIRCUITS

[75] Inventors: Bernardus W. H. Kleiss, Arnhem; Arend J. E. Bretveld; Franciscus J. M. Thus, both of Eindhoven, all of Netherlands

[73] Assignee: U.S. Philips Corporation, New York, N.Y.

[21] Appl. No.: 218,012

[22] Filed: Jul. 12, 1988

[30] Foreign Application Priority Data

Jul. 29, 1987 [GB] United Kingdom ............... 8717983

[51] Int. Cl.⁵ .................... H03K 3/01; H03K 19/091
[52] U.S. Cl. ................................ 307/296.3; 307/459
[58] Field of Search ................ 307/296.3, 459, 299.3, 307/299.1

[56] References Cited

U.S. PATENT DOCUMENTS

| | | | |
|---|---|---|---|
| 4,013,901 | 3/1977 | Williams | 307/299.3 |
| 4,381,010 | 4/1983 | Thompson et al. | 307/459 |
| 4,531,065 | 7/1985 | Nakayama et al. | 307/459 |
| 4,543,499 | 9/1985 | Kaneko et al. | 307/459 |
| 4,672,576 | 6/1987 | Davis | 307/299.3 |
| 4,698,790 | 10/1987 | Davis | 307/299.3 |

FOREIGN PATENT DOCUMENTS 5870333 10/1981 Japan.

Primary Examiner—Stanley D. Miller
Assistant Examiner—Richard Roseen
Attorney, Agent, or Firm—Bernard Franzblau

[57] ABSTRACT

A controlled current supply circuit for semiconductor logic circuitry, such as I²L, which has an unscaled part (10) which remains continuously active and a scaled part (12) which, when not in a data processing mode requiring a high current can be operated at a much lower curent so that the data therein is preserved and power is saved. Unless switching between the low and high currents is carefully controlled then there is a risk of data being lost. A curernt supply circuit (14) responds to a data input signal of the unscaled logic to cause the current supply to the scaled logic (12) to increase or decrease in a number of steps, there being a sufficiently long time delay between steps to allow the scaled logic to settle. The rate of increase or decrease of the injected current is such that there are smaller increments or decrements when the overall current is low causing the scaled logic to be slow and larger increments and decrements when the overall current is high causing the scaled logic to be fast.

19 Claims, 3 Drawing Sheets

POWER SUPPLY CONTROL FOR LOW VOLTAGE I²L CIRCUITS

BACKGROUND OF THE INVENTION

The present invention relates to the control of the electrical power supply for semiconductor logic circuitry, particularly but not exclusively to circuitry powered by one single battery down to 1 volt.

Battery economizing circuits are well known in the fields of manually portable apparatus such as radio paging receivers and transceivers used, for example, by the police, which transceivers have to remain in a standby mode for at least the duration of a shift and only be fully powered when a signal for the particular transceiver is to be made audible or a signal is to be transmitted. The design, construction and operation of such equipment is generally such that different sections of the equipment, such as audio amplifiers and power amplifiers, are switched-on and -off between, say zero volts, and the battery voltage and vice versa.

The above type of control is unsuitable for use with digital circuitry, especially low voltage circuitry such as I²L, which operates between 0.8 V and 1.5 V and has a low current dissipation. This type of circuitry typically comprises two main component parts, unscaled logic which operates at the full voltage to process input and output signals and scaled logic which, for example, comprises a memory and is required to remain energized continuously, if necessary at a current below the full current value, in order to preserve the stored information.

Japanese Kokai 58-70333(A) discloses a two part circuit of which one part remains continuously energized while the power supply to the second part is switched-on and -off using a MOSFET. This Japanese publication does not suggest the possibility of operating the permanently energized circuit part at a lower current when the apparatus is in a standby mode, nor how the power should be controlled as it is switched-on and -off.

If the scaled logic is implemented as one or more integrated circuits then, unless care is taken in controlling the powering-up and -down of the integrated circuit, internal delays and parasitic capacitances can lead to the integrated circuits being brought to a state of readiness at different times, when measured in nanoseconds, so that data may be lost.

SUMMARY OF THE INVENTION

An object of the present invention is to avoid the risk of data being lost by not controlling the power supply correctly.

According to the present invention there is provided the combination of a power supply circuit and a semiconductor logic circuit having an input terminal for the receipt of data to be processed by the logic circuit, the power supply circuit having means responsive to the application of data on the input terminal to increase the current supply to the logic circuit in a plurality of increments and responsive to the termination of data on the input terminal to reduce said current supply in a plurality of decrements.

The present invention is based on the recognition of the fact that if the current supplied to the scaled logic is increased and/or decreased in an optimal manner, then the circuit elements can be maintained in a desired operative state thereby reducing the risk of data being lost.

By increasing and decreasing the supply current in a plurality of steps, then the size of each step and the time delay between initiating successive steps can be optimized for the particular circuitry being powered-up or -down. This flexibility in control is of importance because the lower the current the lower the speed of the circuitry and (herefore the rate of increase/decrease should be smaller, and conversely at higher currents the rate of increase/decrease can be qreater because the speed of the circuitry is greater. By pausing between each step-up or -down then the circuitry can settle each time.

In the scaled down condition current is saved by not only the scaled semiconductor logic circuitry but also the scaler itself consuming a minimum current.

In order not to lose incoming data signals (i.e., "data") when the injected current is being increased, the data may be applied to a delay means which delays the data by sufficient time until it is ready to be processed.

Current may also be saved by switching-off an oscillator signal applied to the logic circuit during the period between the data signal being discontinued and resumed. Another reason for switching-off the oscillator signal is that if the logic circuit is operating at a minimum supply current situation, its operating speed is too slow to be able to be switched at the oscillator frequency.

BRIEF DESCRIPTION OF THE DRAWINGS

The present invention will now be described, by way of example, with reference to the accompanying drawings, wherein.

DESCRIPTION OF THE PREFERRED EMBODIMENTS

Figure 1:
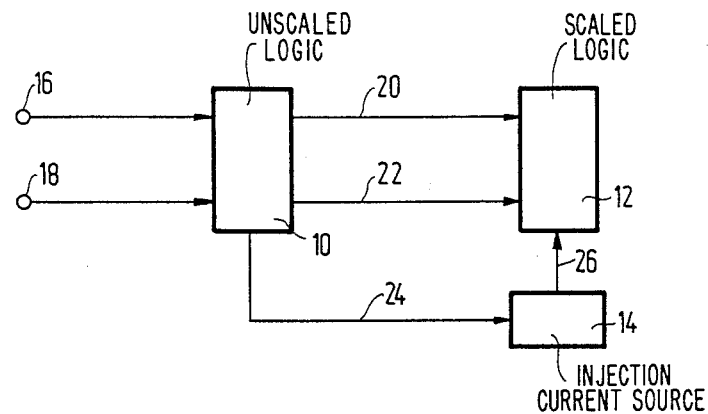
FIG. 1 is a block schematic diagram illustrating an application of injector current scaling.

In the drawings corresponding reference numerals have been used indicate the same elements.

The circuit shown in FIG. 1 comprises unscaled logic 10, scaled logic 12 and a scaled injection current source 14. An oscillator input 16 and a data input 18 are connected to the unscaled logic 10. Lines 20 and 22, respectively, supply oscillator and data signals to the scaled logic 12. The unscaled logic supplies an on-(or standby) signal to the current source 14 on a line 24 The scaled logic 12 receives a scaled injector current from the source 14 on a line 26.

For convenience of description the unscaled and scaled logic 10, 12 comprise I²L circuitry used, for example, in control functions such as volume and tone control in hearing aids. However, the principles of the present invention are applicable to other implementations of digital circuitry. Many digital circuits, notably in the field of telecommunications, are utilized for a short time only but when utilized they then they must be able to process incoming data signals directly. If the unscaled and scaled logic 10, 12 are maintained fully active then the current consumption is needlessly high.

In the circuit shown in FIG. 1 the scaled logic 12 can be put into a standby mode when it is not being utilized to process input data. In the standby mode, the scaled logic draws a low current sufficient to maintain the current status of the circuitry. At low current the scaled logic 12 operates at a low speed. However, when input data is detected, which data has to be processed in the scaled logic 12, then it is necessary to increase the injected current from say 20 nA per gate to a high value of 1000 nA per gate, assuming a clock frequency on the order of 20 kHz. The delay times current product is of the order of 1 $\mu A \times 1$ $\mu sec$ per gate and it is this product which limits the rate at which current is injected or reduced.

In FIG. 1 the current supply to the entire scaled logic 12 is controlled and supplied by the current source 14. The source 14 is permanently active and one of its functions is to check for the presence of an input data signal indicated by an on-(or standby) signal on the line 24. In response to detecting the presence of an on-signal, the current source 14 scales up the current to be injected.

Figure 2:
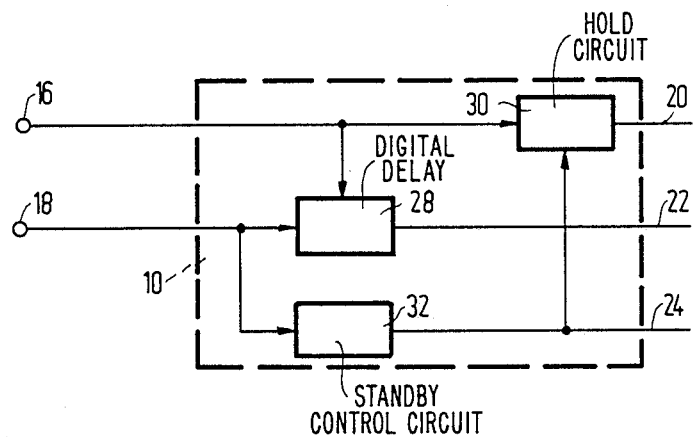
FIG. 2 is a block schematic diagram illustrating the principle of the unscaled logic shown in FIG. 1.

In view of the fact that it takes a finite time to scaleup the current to be supplied to the scaled logic 12, it is necessary to delay the application of input data to the scaled logic 12. FIG. 2 illustrates one embodiment showing how this can be done in the unscaled logic 10. The oscillator input 16 is connected to a digital delay line 28 and to an oscillator hold circuit 30. The data input 18 is connected to the digital delay line 28 and to a standby control circuit 32. Data present on the data input 18 is delayed by the delay line 28 in order to give the scaled logic sufficient time to become active. The standby control circuit 32 provides the on- (or standby) signal in response to the presence of data on the input 18, which signal is applied to the current source 14. However, when no data is present on the input 18, then it provides a standby signal which not only causes the injected current to be reduced but also switches-off the oscillator signal for the scaled logic 12 because this logic has become too slow to be triggered by the oscillator signal.

Figure 3:
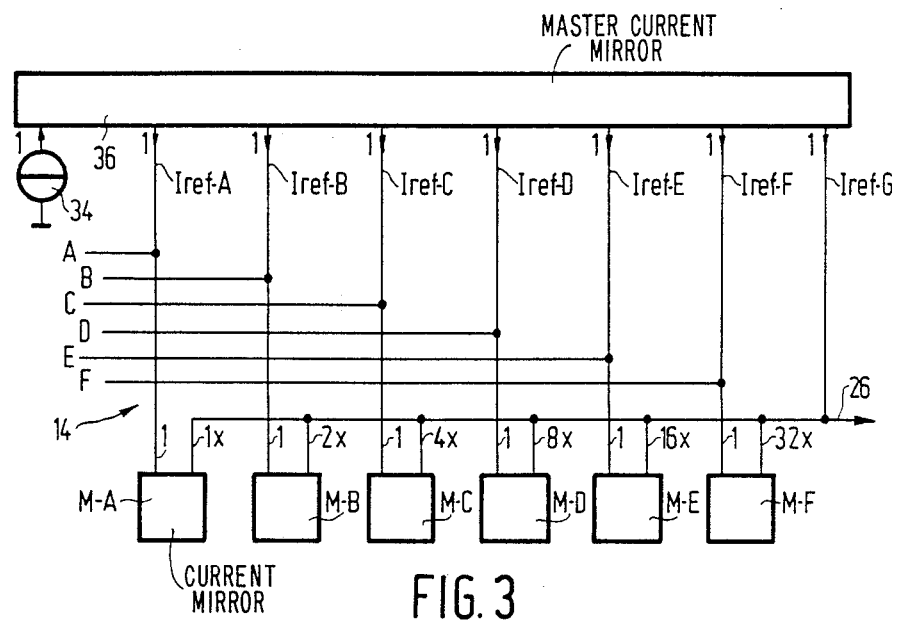
FIG. 3 is a block schematic diagram illustrating the controlled current source.
Figure 4:
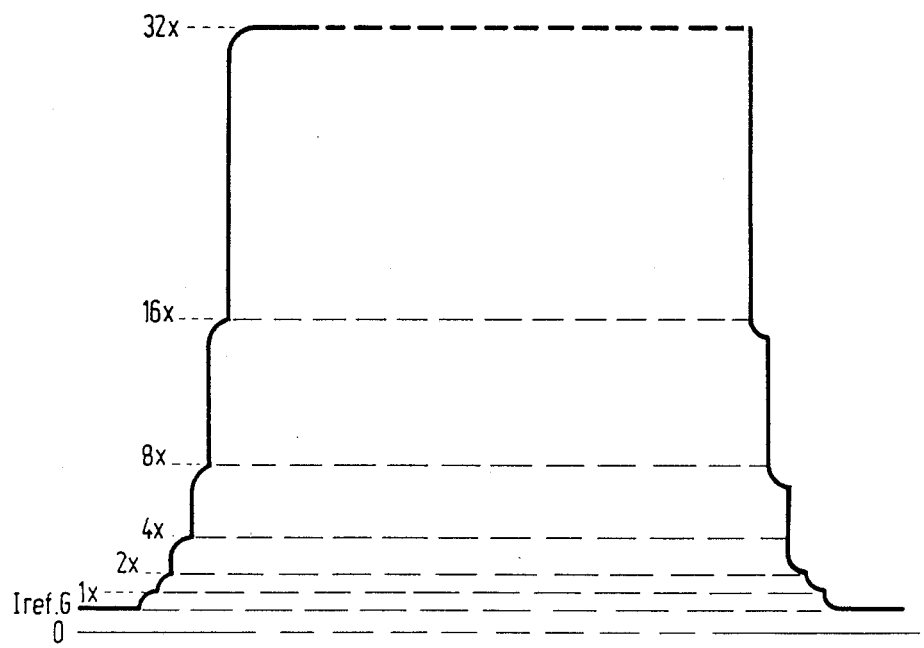
FIG. 4 is a graph illustrating the scaling-up by a factor of 2 and the scaling-down of the injector current by a factor of ½.

When the standby current circuit 32 produces an on-signal then the current source 14 (FIGS. 1, 3 and 5) increases the injected current in a plurality of steps (see the left hand side of the current waveform shown in FIG. 4). During the increase of the injector current the logic contact among all gates is to be maintained in the scaled logic 12. This means that a gate must be able to "sink" the current of another gate with which it communicates and must thus be adjusted to the same current level. If the bias current is suddenly increased approximately one hundred times it is possible that this requirement is not complied with for a short time because the variation of the bias current will not be taking place uniformly across all gates due, for example, to parasitic effects in the injector lead. The result may be that the logic contact between two gates is disturbed for a moment and the logic state is not satisfactorily maintained. The same phenomenon may occur when the total bias current is decreased too suddenly.

When determining the rate of increase or decrease in the injected current, regard has to be paid to the technology of the scaled logic 12. In, for example, I²L logic the difference in injector currents of two communicating gates may never be larger than the current gain factor of such a gate, for example, 2. The injector current thus has to be increased in successive steps which should never exceed a factor of 2. After each step a pause is required in order to enable the scaled logic to regain its injector current balance.

Referring to FIG. 3, the current source 14 comprises a reference current source 34, the current from which is copied seven times in a master current mirror 36 to produce reference currents $I_{refA}$ to $I_{refG}$, all having a relative value of unity. The reference currents $I_{refA}$ to $I_{refG}$ are applied to respective current mirrors M-A to M-F. These current mirrors amplify their respective input currents in increasing order by 1, 2, 4, 8, 16 and 32 times. The output currents from the current mirrors M-A to M-F are added on the line 26 together with the reference current $I_{refG}$ which constitutes the minimum bias current to the scaled logic 12 (FIG. 1).

Control of the output currents from the current mirrors M-A to M-F is effected by means of the points or control lines A to F which, if active, divert or sink one or more of the reference currents $I_{refA}$ to $I_{refF}$ thus starving the associated current mirror M-A to M-F. Conversely, if one or more of the points A to F is or are rendered inactive then the associated current mirror M-A to M-F is effective.

In the case of scaling-up the current, one commences with $I_{refG}$ on the line 26. Increasing the current by 2 is readily effected by suitable control of the points A to F. An advantage of scaling-up in this manner is that the current increase commences slowly and in so doing matches the speed of the circuitry, and subsequently the current increase speeds up. In controlling the deactivation of the points A to F sufficient time has to be allowed to enable the scaled logic 12 (FIG. 1) to settle down. Returning the scaled logic 12 to standby involves activating the points A to F in reverse order commencing with the point F. Thus the decrease is half the preceding current which matches the decreasing speed of the scaled logic. A suitable increase and decrease in the injected current is illustrated in FIG. 4.

Figure 5:
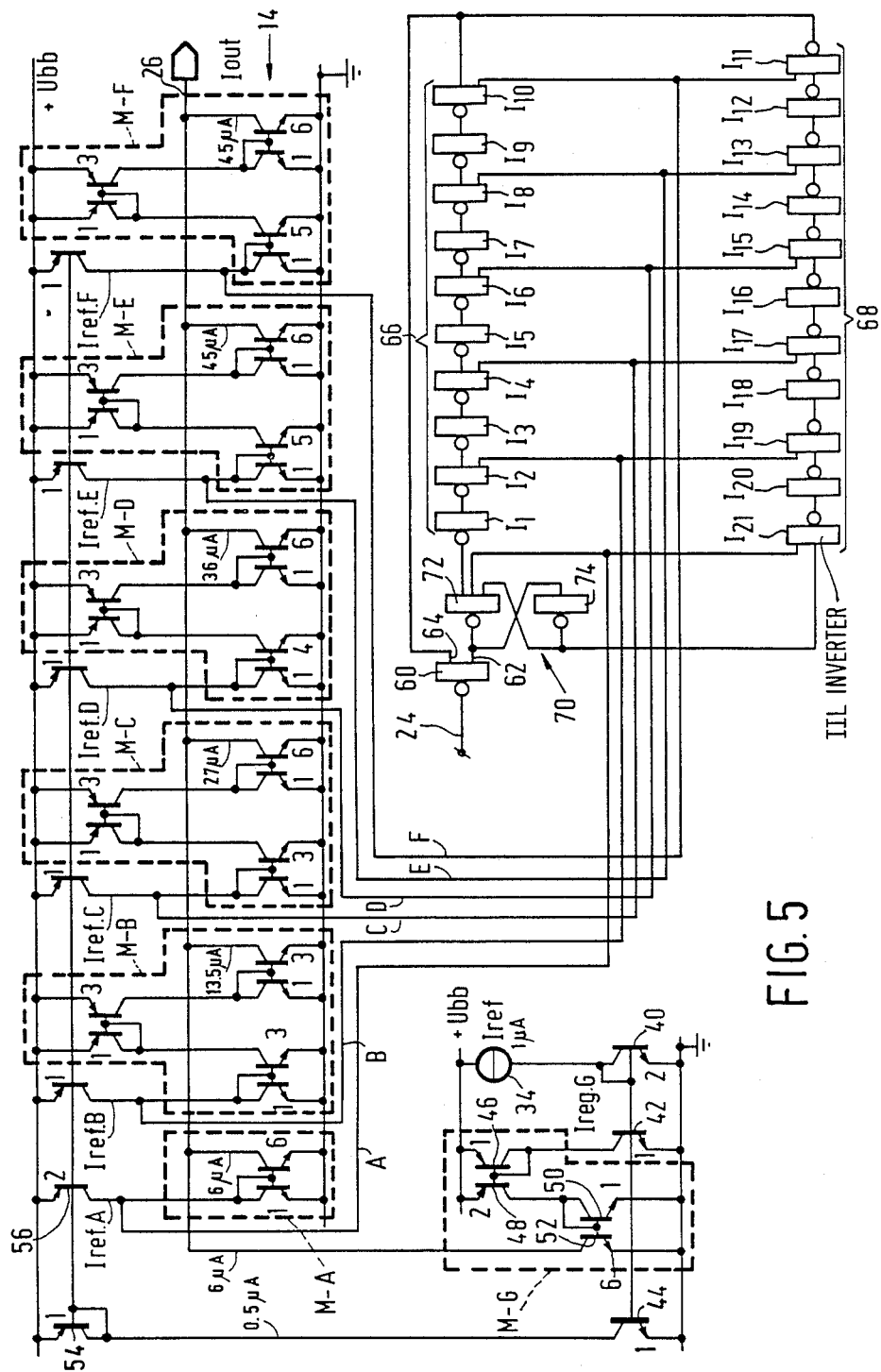
FIG. 5 is a circuit diagram, partly in block schematic form, of an embodiment of (he controlled current source together with its control circuitry.

Referring now to FIG. 5 which illustrates an embodiment of the current source 14. The source comprises two main parts, a first part comprising a plurality of current mirror circuits and a second part comprising a scaling or timing chain formed by a plurality of inverters.

The current mirror circuits have been implemented in bipolar technology using NPN and PNP transistors. A reference current $I_{ref}$ of 1 $\mu A$ produced by a reference current source 34 is copied seven times in current mirror circuits M-A to M-G. The reference current of 1 $\mu A$ produced by the source 34 is halved by the currents mirrors formed 20 by the transistors 40, 42 and 40, 44, respectively. Thus in the current mirror circuit M-G the 0.5 $\mu A$ collector current from the current source 42 is doubled in a first stage of amplification constituted by the transistors 46, 48 connected as a first current mirror. The collector current from the transistor 48 is amplified by a factor of six in a second current mirror constituted by the transistors 50, 52. The output current of 6.0 $\mu A$ is applied to the output line 26. As the circuit M-G remains permanently operative it provides the minimum current to maintain the data in the scaled logic (FIG. 1).

Transistors 44 and 54 provide a master reference current of 0.5 $\mu A$ to the current mirror circuits M-A to M-F.

The current source formed by the NPN transistor 56 doubles the reference current so that $I_{refA}$ equals 1.0 $\mu A$.

The generation of an output current of 6 μA is carried out in a similar manner as in the circuit M-G and accordingly a detailed explanation will not be qiven. However, whether or not the current amplification part is active. If it is active then the 1 μA current produced by the transistor 56 is sunk and there is no extra current on the line 26. Alternatively if the control line is inactive then an output current of 6.0 μA is supplied to the line 26.

The current mirror circuits M-B to M-F each comprise three stages of amplification. As their construction and operation will be understood from the preceding description they will not be described in detail. However, for the sake of completeness the gain per stage will be given together with the final current from each stage.

| | | |
|---|---|---|
| Stage M-B | 3 × 3 × 3 | 13.5 μA |
| Stage M-C | 3 × 3 × 6 | 27.0 μA |
| Stage M-D | 4 × 3 × 6 | 36.0 μA |
| Stage M-E | 5 × 3 × 6 | 45.0 μA |
| Stage M-F | 5 × 3 × 6 | 45.0 μA |

Unlike the circuit described with reference to FIG. 3, the output currents do not increase in increments of 2. However, this is not essential because the current steps-up or -down are tailored to suit the specific scaled logic and the technology in which it is implemented.

Referring to the scaling or timing chain part of FIG. 5. This is implemented in I$^2$L using inverters. The line 24 which supplies the on- (or $\overline{\text{standby}}$) signal is connected to an input stage 60 which is an I$^2$L inverter having two outputs 62, 64 each transmitting a logic signal of the same polarity. The logic states at an output of an I$^2$L gate are represented by either an open circuit or an output draining a current. Two tapped delay lines 66, 68 constituted by series connected inverters $I_1$ to $I_{10}$ and $I_{11}$ to $I_{21}$, respectively, are provided. A set/reset flip-flop circuit 70, formed by cross-coupled inverters 72, 74, is connected to the output 62, to the input of the delay line 66 and to the output of the delay line 68. The point or control line A is connected to the inverters 72 and $I_{21}$, whereas the points or control lines B to F are respectively connected to a tappinq point in each of the delay lines. More specifically point B is connected to outputs of inverters $I_2$, $I_{19}$, point C to $I_4$, $I_{17}$, point D to $I_6$, $I_{15}$, point E to $I_8$, $I_{13}$ and point F to $I_{10}$, $I_{11}$. By such an arrangement a time delay equal to a signal transit time through two inverters occurs between each current step-up or -down. However, it should be understood that the tapped delay lines 66 and 68 can be implemented so that the time delay between each step is not identical and/or so that the rate of increase in the current when stepping-up is different to the rate of decrease in the current when stepping-down. Alternatively (he rate of scaling-up and -down can be chosen by adjusting the injector current for this part of the circuit.

On receipt of an on-signal on the line 24 the delay line 66 is utilized via an output from the inverter 72. Conversely on receipt of an off-(or standby ) signal on the line 24, the inverter 60 provides a signal on the output 64 which activates the delay line 68 causing the points F to A to become inactive in turn and thereby reduce the injected current in steps. The output from the inverter resets the flip-flop 70 so that it is ready for the next on-signal.

Another favourable feature of the embodiment shown in FIG. 5 is that it is capable of operating at low voltages of the order of 0.8 V, approximately the discharge voltage value of a battery.

What is claimed is:

1. An integrated circuit comprising, in combination, a semiconductor logic circuit having an input terminal for receipt of data to be processed by the logic circuit, and a power supply circuit coupled to said semiconductor logic circuit to supply operating current thereto, said power supply circuit having means responsive to data present on the input terminal for increasing the current supply to the logic circuit in a plurality of current increments and responsive to a termination of data on the input terminal for reducing said current supply to the logic circuit in a plurality of current decrements.

2. A combination as claimed in claim 1, further comprising delay means coupled to said input terminal for delaying the data to be processed until the current supply has been incremented to a predetermined level.

3. A combination as claimed in claim 1, further comprising an oscillator circuit coupled to the logic circuit, said oscillator circuit being controlled by said means so that an oscillator-signal is applied to the logic circuit only during a time period when data is being applied to the input terminal.

4. A combination as claimed in claim 1, wherein the increments and decrements are relatively small at low operating currents and relatively large at high operating currents of the semiconductor logic circuit.

5. A combination as claimed in claim 1, wherein there are equal pluralities of increments and decrements of current.

6. A combination as claimed in claim 1, wherein the means for increasing and reducing the current supply of said power supply circuit comprises delay means for producing a time delay between successive increments or successive decrements of current.

7. A combination as claimed in claim 1, wherein the power supply circuit includes a plurality of n current amplifiers, where n > 2, for amplifying a reference current applied to an input circuit, each of the current amplifiers having an output connected to an output current line for the logic circuit, and wherein the power supply circuit further includes control means coupled to input circuits of n-1 current amplifiers for controlling the application of the reference current to the associated current amplifier.

8. A combination as claimed in claim 7, wherein the nth current amplifier provides sufficient current to the logic circuit to preserve the data therein.

9. A combination as claimed in claim 8, wherein each current amplifier comprises at least one current mirror circuit and each current mirror circuit has an output line coupled to said semiconductor logic circuit to supply said operating current thereto.

10. A combination as claimed in claim 2, further comprising an oscillator circuit coupled to the logic circuit, said oscillator circuit being controlled by said means so that an oscillator-signal is applied to the logic circuit only during a time period when data is being applied to the input terminal.

11. A combination as claimed in claim 2 wherein the increments and decrements of current are relatively small at low operating currents and relatively large at high operating currents of the semiconductor logic circuit.

12. A combination as claimed in claim 3 wherein the increments and decrements of current have smaller values at lower currents than at higher currents of the semiconductor logic circuit.

13. A combination as claimed in claim 3 wherein the means for increasing and reducing the current supply of said power supply circuit comprises delay means for producing a time delay between successive increments or successive decrements of current.

14. A combination as claimed in claim 4 wherein the means for increasing and reducing the current supply of said power supply circuit comprises delay means for producing a time delay between successive increments or successive decrements of current.

15. A combination as claimed in claim 4 wherein the power supply circuit includes a plurality of n current amplifiers, where $n \geq 2$, for amplifying a reference current applied to an input circuit of each amplifier, each of the current amplifiers having an output connected to an output current line for the logic circuit, and wherein the power supply circuit further includes control means coupled to input circuits of n-1 current amplifiers for controlling the application of the reference current to the associated current amplifier.

16. A battery-fed apparatus comprising: a semiconductor logic circuit having an input terminal for data to be processed therein, said semiconductor login circuit having a stand-by mode and an operating mode, a power supply circuit energized by a battery and having output means coupled to said semiconductor logic circuit for supplying operating currents thereto, and means coupled to said input terminal for selectively controlling the power supply circuit into first and second current modes corresponding to said stand-by and operating modes of the semiconductor logic circuit, respectively, and as a function of the absence or presence of data at said input terminal, respectively wherein said power supply circuit, in its second current mode, includes means for increasing the supply of operating current to the semiconductor logic circuit in a plurality of current increments, and said power supply circuit includes means for decreasing the supply of operating current to the semiconductor logic circuit in a plurality of current decrements in response to a control signal from said control means indicative of the absence of data on said input terminal.

17. An apparatus as claimed in claim 16, wherein said means for increasing and decreasing the current is adapted to produce relatively small increments and decrements of current when the operating current is low and produces relatively large increments and decrements of current when the operating current is at a high level.

18. An apparatus as claimed in claim 16, wherein said means for increasing and decreasing the operating current produces at least two successive increments or decrements of current of unequal values.

19. An apparatus as claimed in claim 16, wherein said controlling means includes delay means coupled between said input terminal of the semiconductor login circuit and a data input for supplying the data to be processed whereby said data is delayed so as to allow the power supply circuit to increment the operating current for the semiconductor logic circuit to a predetermined level.

* * * * *